US010473710B2

(12) United States Patent
Sullivan

(10) Patent No.: US 10,473,710 B2
(45) Date of Patent: Nov. 12, 2019

(54) DESATURATION DETECTION CIRCUIT AND DESATURATION CIRCUIT MONITORING FUNCTION

(71) Applicant: Avago Technologies International Sales Pte. Limited, Singapore (SG)

(72) Inventor: Patrick Sullivan, Holzgerlingen (DE)

(73) Assignee: Avago Technologies International Sales Pte. Limited, Singapore (SG)

( * ) Notice: Subject to any disclaimer, the term of this patent is extended or adjusted under 35 U.S.C. 154(b) by 344 days.

(21) Appl. No.: 14/926,257

(22) Filed: Oct. 29, 2015

(65) Prior Publication Data

US 2017/0122996 A1    May 4, 2017

(51) Int. Cl.
  *G01R 31/02* (2006.01)
  *G01R 31/26* (2014.01)
  *H03K 17/082* (2006.01)

(52) U.S. Cl.
  CPC ..... *G01R 31/2619* (2013.01); *H03K 17/0828* (2013.01)

(58) Field of Classification Search
  CPC ............ G01R 31/2619; G01R 31/2608; G01R 31/2614; G01R 31/2621; G01R 31/261; G01R 31/2607; G01R 31/275; G01R 31/025; G01R 31/31924; G01R 31/3004; G01R 31/3008; G01R 31/2884; H03K 17/0828; H03K 31/0826; H03K 31/567; H03K 31/168; H03K 31/08116
  USPC ........ 1/762.01, 762.02, 762.08, 762.09, 522, 1/523, 537, 750.01
  See application file for complete search history.

(56) References Cited

U.S. PATENT DOCUMENTS

| 7,274,243 | B2 | 9/2007 | Pace et al. |
| 7,768,337 | B2* | 8/2010 | Bayerer ............. H03K 17/0406 327/389 |
| 2004/0136131 | A1* | 7/2004 | Kim ................... H03K 17/0828 361/91.1 |
| 2005/0253165 | A1* | 11/2005 | Pace ..................... H02M 7/538 257/139 |
| 2014/0203843 | A1* | 7/2014 | Cottell ................... H03K 17/78 327/81 |
| 2014/0233278 | A1* | 8/2014 | Li ...................... H02M 7/53873 363/37 |
| 2015/0155700 | A1* | 6/2015 | Alvarez Valenzuela ..................... H02H 3/08 361/93.9 |
| 2016/0028219 | A1* | 1/2016 | Habu ....................... H03F 1/52 361/101 |

(Continued)

OTHER PUBLICATIONS

"ISO5500 2.5—A Isolated IGBT, MOSFET Gate Driver", Texas Instruments Incorporated, Sep. 2011, Revised Jan. 2015, 43 pages.

(Continued)

*Primary Examiner* — Thang X Le
(74) *Attorney, Agent, or Firm* — Sheridan Ross P.C.

(57) ABSTRACT

Systems, circuits, and chips for protecting transistors and circuits containing transistors are provided. As an example, a transistor (e.g., an Insulated-Gate Bipolar Transistor (IGBT)) monitoring system is disclosed to include an IGBT desaturation detection circuit that is configured to check and monitor desaturation functionality of the IGBT before startup of the IGBT as well as during operation of the IGBT.

20 Claims, 5 Drawing Sheets

(56) References Cited

U.S. PATENT DOCUMENTS

2016/0282407 A1* 9/2016 Bacigalupo ........ G01R 31/2621
2016/0336936 A1* 11/2016 Ma ...................... H03K 17/168

OTHER PUBLICATIONS

"Single IGBT Gate Driver", Semiconductor Components Industries, LLC, Aug. 2013, 14 pages.

* cited by examiner

DESATURATION DETECTION CIRCUIT AND DESATURATION CIRCUIT MONITORING FUNCTION

FIELD OF THE DISCLOSURE

The present disclosure is generally directed toward IGBT driver circuits and short-circuit protection circuits.

BACKGROUND

The Insulated-Gate Bipolar Transistor (IGBT) is a three-terminal power semiconductor device primarily used as an electronic switch and in newer devices is noted for combining high efficiency and fast switching. It switches electric power in many modern appliances such as: Variable-Frequency Drives (VFDs), electric cars, trains, variable speed refrigerators, lamp ballasts, air-conditioners, and even stereo systems with switching amplifiers.

IGBTs are often used for high voltage (e.g., greater than 600V) and high-current power converter applications. In these types of applications, a short-circuit of the load wire to a power source will result in a large current flowing through the IGBT, which is likely to damage the IGBT. Because of the potential for damage to IGBTs, gate drive circuits must detect IGBT short-circuit conditions and turn off the IGBT safely to prevent damage to the IGBT.

Desaturation, also referred to herein as "DESAT", detection is a technique used to determine whether a transistor (e.g., an IGBT or Metal-Oxide-Semiconductor Field-Effect Transistor (MOSFET) is operating in a fully turned on condition. If the transistor is only partially turned on or in a DESAT condition, there is the possibility for the device to overheat and self destruct.

A DESAT condition may be caused by a number of events such as: excessive current; incorrect gate drive; or other faults in the transistor. To prevent such conditions and to avoid permanent damage to the transistor, it is important that the DESAT condition be detected and preventative action be taken in a timely manner.

BRIEF DESCRIPTION OF THE DRAWINGS

The present disclosure is described in conjunction with the appended figures, which are not necessarily drawn to scale.

DETAILED DESCRIPTION

Figure 1:
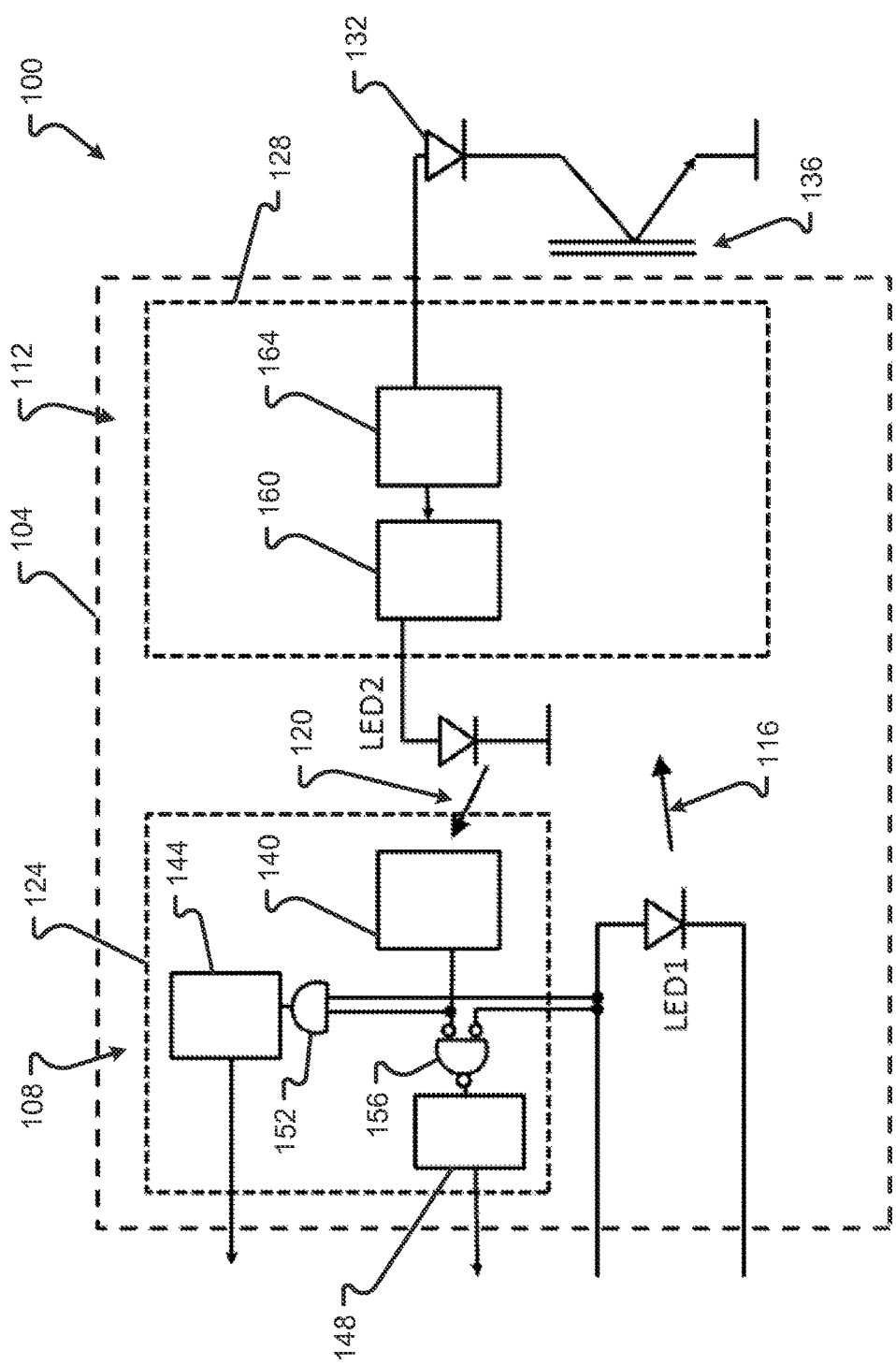
FIG. 1 is a block diagram depicting a first isolation system in accordance with at least some embodiments of the present disclosure.

It is with respect to the above-noted challenges that embodiments of the present disclosure were contemplated. In particular, a system, circuits, and method of operating such circuits are provided that solve the drawbacks associated short-circuit protection circuits of the prior art.

While embodiments of the present disclosure will primarily be described in connection with protection mechanisms for transistors such as IGBTs or MOSFETs, it should be appreciated that embodiments of the present disclosure are not so limited. In particular, embodiments of the present disclosure can be used in connection with monitoring and protecting circuits containing transistors (e.g., IGBTs and/or MOSFETs) or any other type of circuit component or collection of components that are subject to desaturation conditions.

Various aspects of the present disclosure will be described herein with reference to drawings that are schematic illustrations of idealized configurations. It should be appreciated that while particular circuit configurations and circuit elements are described herein, embodiments of the present disclosure are not limited to the illustrative circuit configurations and/or circuit elements depicted and described herein. Specifically, it should be appreciated that circuit elements of a particular type or function may be replaced with one or multiple other circuit elements to achieve a similar function without departing from the scope of the present disclosure.

It should also be appreciated that the embodiments described herein may be implemented in any number of form factors. Specifically, the entirety of the circuits disclosed herein may be implemented in silicon as a fully-integrated solution (e.g., as a single Integrated Circuit (IC) chip or multiple IC chips) or they may be implemented as discrete components connected to a Printed Circuit Board (PCB).

The normal method to detect the DESAT condition is to monitor the saturation voltage of the MOSFET or IGBT when it is turned on. If the device is switched on and the DESAT voltage exceeds a predetermined threshold the device is determined to have entered an unsafe state and preventative action such as switching off the device is performed. This and most other DESAT detection functions are often considered to be an essential safety feature, especially when the MOSFET or IGBT is being used in large-scale operations or in connection with heavy machinery. If the DESAT detection function should fail and the IGBT is operated in an overload condition, the resultant collateral destruction can be extremely hazardous.

To prevent such hazards, especially in applications such as Automotive drives and certain industrial drive systems, it is useful that that DESAT function be proven to be functional before attempting to turn on the IGBT or MOSFET. In addition to checking the DESAT function before start up the equipment, it is also an advantage to continuously monitor the correct operation of the DESAT before every attempt to turn on the IGBT.

Traditional methods of checking the DESAT function achieved this check requirement by switching on the IGBT for a short period of time (e.g., less than 10 uS) into a short circuit load condition and then checking that the DESAT condition is detected. The problem with such a method is that it can only be applied once before start up and there is no continuous monitoring during nominal operation. So such a method will not detect faults which occur during run-time.

Other techniques for checking the correct operation of the DESAT, perform check functions on the DESAT current source, comparator and band gap reference. The problem with such check functions is that they do not test the complete DESAT circuit including external components and connections.

Another challenge is associated with the communication method used to transmit such a DESAT condition. In particular, because of the presence of high common mode voltages and safety concerns, this signal needs to be galvanically isolated when transmitted to a monitoring circuit. This isolation may be achieved using any type of galvanic isolation device, such as optocouplers, inductive couplers, capacitive couplers, and/or magnetic isolation devices. Since a failure can also occur in the isolation channel, the health of the isolation channel also needs to be checked to determine if a DESAT condition is occurring or there is an issued with the isolation channel.

It is, therefore, one aspect of the present disclosure to provide a mechanism to check and monitor the DESAT functionality of a transistor or a circuit including a transistor before startup and during nominal operation of the circuit/transistor.

The DESAT detection circuit, in some embodiments, uses a current source and comparator to detect a DESAT condition. One difference to prior DESAT detection circuits is that the DESAT detection circuit described herein is not only active during turn on, it is also active during turn off. In some embodiments, the only time at which the DESAT detection circuit is deactivated, is for a short time period just before and after the IGBT or MOSFET is turned on.

Another difference is the method used to control the voltage on the DESAT blanking capacitor immediately before and after turn on. A DESAT blanking capacitor is typically used to delay the activation of DESAT conditions to prevent false trigger during turn on. To enhance the noise rejection it is common place to use a MOSFET to hold this blanking capacitor low before turn on and then hold it on for a short period of time after turn on, to avoid transient turn on noise.

The mechanism described herein utilizes a different approach on the blanking capacitor discharge circuit. Instead of holding the blanking pin low prior to the turn on trigger signal, the DESAT blanking capacitor discharge circuit is only active for a very short time just before turn on. There are several possible methods to implement such an arrangement. As an example, the DESAT blanking capacitor discharge period can be set by a monostable pulse generator, which is activated on the rising edge of the IGBT turn on signal. The width of the pulse may be just wide enough to firstly ensure that that the blanking capacitor is fully discharged and secondly to provide transient noise rejection on the IGBT turn on. To ensure that the DESAT detection circuit is fully functional before IGBT turn on, the IGBT turn on is delayed by a period slightly less than the DESAT blanking period.

In previous systems the DESAT output signal is only active during either a test mode or during IGBT/MOSFET turn on. In some embodiments, the DESAT signal is always active. To determine whether the DESAT's signal activation is due to the IGBT being in the off state or a real DESAT overload, it may be useful to use the input status. If the input is off and the DESAT condition is active, this may indicate that DESAT detection circuit is operating normally. On the other hand, if the DESAT signal is not detected, this may correspond to an indication of a fault in the DESAT detection circuit.

If the input is on and the DESAT signal is active, this may be indicative of either an overcurrent condition or, alternatively, a fault in either the gate drive circuitry or the IGBT.

To allow for quick determination of the cause of the DESAT signal, the DESAT signal's logic is combined with the status of the input signal to generate two additional signals DESAT OVERLOAD and DESAT FAILED. Due to the transient nature of the switching IGBT cycle, there may be a short interval of time when either of these signals will give an incorrect status. To prevent erroneous actions during this time period, and in some embodiments, after each input edge transition a short time blanking delay may be activated before the signals become active.

With reference now to FIG. 1, additional details of an isolation system 100 including a DESAT detection circuit will be described in accordance with at least some embodiments of the present disclosure. The isolation system 100 is depicted as being an optical isolation system (e.g., a system that uses optical signals or light to communicate signals across an isolation boundary). It should be appreciated, however, that the isolation system 100 may be altered to be any type of isolation system (e.g., inductive, capacitive, magnetic, etc.) without departing from the scope of the present disclosure.

The isolation system 100 is shown to include a set of IC chips 104 having a first isolated circuit 108 and a second isolated circuit 112. The components of the first isolated circuit 108 may utilize a different ground than the components of the second isolated circuit 112. Moreover, the isolated circuits 108, 112 may operate at substantially different nominal voltages (e.g., a difference of 600V or more). Thus, optical signals 116, 120 are used to communicate information across an isolation boundary and between the isolated circuits 108, 112.

The first isolated circuit 108 is shown to include an input IC chip 124 connected to a first light source LED1. Although the light source is depicted as an LED, it should be appreciated that the light source may correspond to any source of optical energy such as a laser diode, a VCSEL, a collection of LEDs, etc. Components of the input IC chip 124 are depicted as including a receiver/decoder 140, a first blanking delay component 144, a second blanking delay component 148, and a pair of logic gates 152, 156. The first isolated circuit 108 employs the input IC chip 124 to monitor the input signals received at the first light source LED1 by a light source driver, which may be external to the set of IC chips 104 or may be incorporated therein. In particular, the input IC chip 124 taps the input of the first light source LED1 and provides the input signal to both of the logic gates 152, 156.

The logic gates 152, 156 are depicted as being OR gates, but it should be appreciated that any type of logic gate or collection of logic components can be used in the input IC chip 124 to receive the input signal of the first light source LED1 and compare that input signal with another signal. In the depicted embodiment, the logic gates 152, 156 compare the input signal with a signal received from the receiver/decoder 140, which is producing an electrical signal in accordance with an optical signal 120 received from a second light source LED2 of the second isolated circuit 112. The output of the receiver/decoder 140 represents an electronic version of the optical signal 120 and may be modulated with data similar or identical to the data encoded on the second optical signal 120. The receiver/decoder 140 may receive the optical signal 120 and decode the optical signal into an electrical signal which is output to the logic gates 152, 156. The logic gates 152, 156 compare the electrical signal received from the receiver/decoder 140 with the tapped input signal of the first light source LED1 to produce outputs for the blanking delay components 144, 148.

In some embodiments, the blanking delay components 144, 148 may correspond to circuit components or a collection of circuit components that delay the signal output by the logic gates 152, 156 for a predetermined amount of time. As an example, both blanking delay components 144, 148 may delay the output of the logic gates 152, 156 for approximately 2.0 us. In some embodiments, the blanking delay is used to cover the indeterminate condition when an IGBT is switching on. In some embodiments, the blanking delay created by the blanking delay components 144, 148 may also be used to detect an overheating of the IGBT as will be discussed in further detail herein. In some embodiments, the first blanking delay component 144 may be configured to produce a DESAT signal output whereas the second blanking delay component 148 may be configured to produce a DESAT circuit fail output. In other words, the input IC chip 124 may be configured to simultaneously produce both a DESAT signal output indicative of a DESAT condition at a transistor along with a DESAT circuit fail output indicative of a failure at the DESAT detection circuit (e.g., a component in the second isolated circuit 112).

The second isolated circuit 112 may correspond to the component of the isolation system 100 that monitors the transistor 136 for a DESAT condition. Specifically, the second isolated circuit 112 is depicted to include a DESAT detection circuit 164 and an encoder 160 that are provided on an output IC chip 128. The DESAT detection circuit 164 may be connected to the transistor 136 being monitored via a diode 132 or similar current-biasing element. In some embodiments, the DESAT detection circuit 164 is configured to monitor the transistor 136 for a DESAT condition and, if such a condition is detected, cause the encoder 160 to produce an appropriate drive signal for the second light source LED2, which causes the transmission of an appropriately encoded optical signal 120. The optical signal 120 transmitted by the second light source LED2 may provide an indication of a DESAT condition or, in some embodiments, the constant transmission of the optical signal 120 may indicate the absence of a DESAT condition and when the optical signal 120 is not transmitted, then a DESAT condition may be determined by the input IC chip 124.

Figure 5:
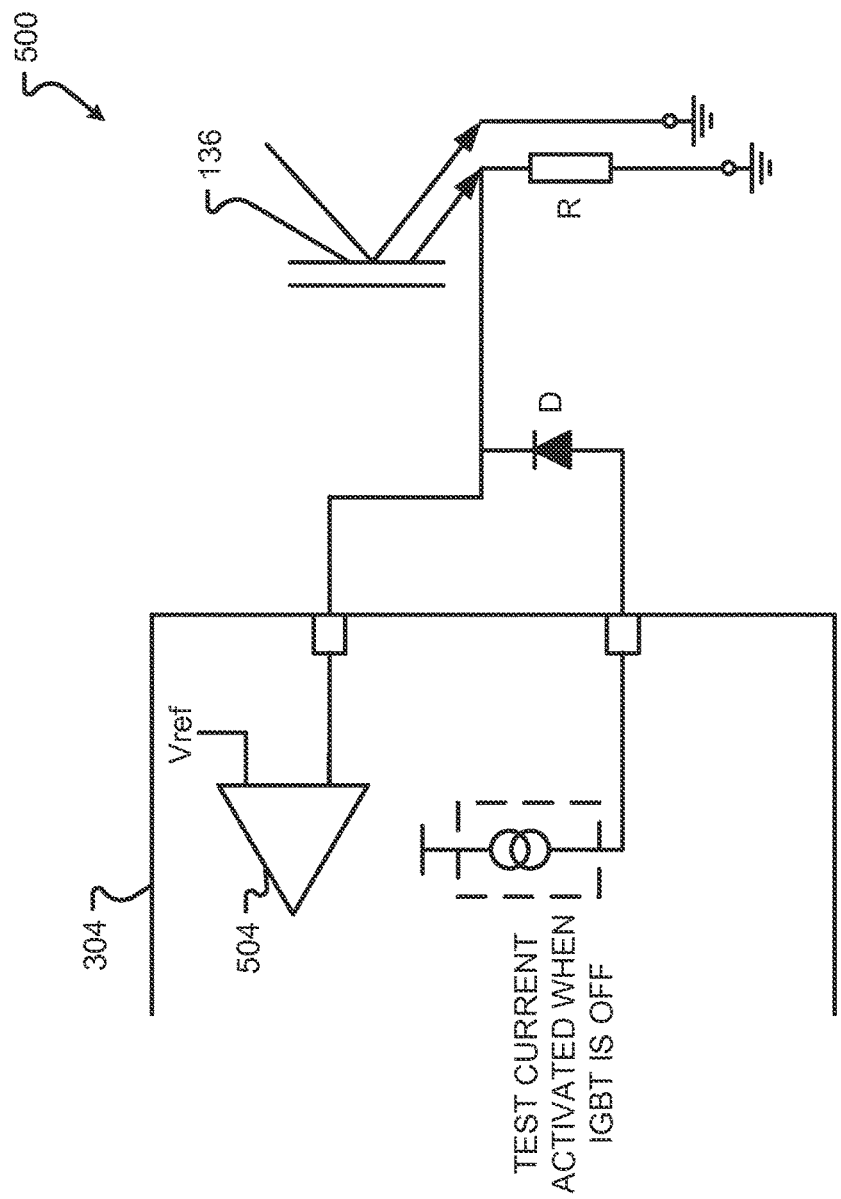
FIG. 5 is a diagram depicting an emitter sense current sense check circuit in accordance with at least some embodiments of the present disclosure.

In some cases, a particular type of IGBT technology which implemented a purposed design split emitter connection may be used. This split emitter connection may also be used to detect an overload fault current. Such a fault detection circuit could also similarly be monitored to ensure that the circuit is operating properly. FIG. 5 depicts an illustrative example of such a circuit 500. As shown in FIG. 5, during the IGBT OFF state, a test current is activated into the emitter sense resistor R, which in turn activates the over current detection comparator 504. In some embodiments, this circuit 500 implements an IGBT technology which has a split emitter connection that taps off a small amount of the emitter current from the IGBT 136 for current sensing purposes at the comparator 504. This emitter sense connection is normally connected to a resistor R which then provides a voltage signal that is proportional to the current flowing therethrough.

As will be discussed in further detail herein, the output IC chip 128 may be configured to additionally or alternatively monitor the transistor 136 for other potential failure conditions such as overheating and the like. As a non-limiting example, the output IC chip 128 may include one or more components that detect temperature or overheating situations with a Negative Temperature Coefficient (NTC) resistor. Such components could run their appropriate temperature-checking tests when the transistor 136 is turned off In accordance with at least some embodiments, the following logic table may be followed by the input IC chip 124 and its components to determine whether a DESAT condition is occurring and/or whether there is a problem with the DESAT detection circuit 164.

TABLE 1

| DESAT condition determination | | | |
|---|---|---|---|
| | Desat Overload Or IGBT off | LED1 anode High | LED1 anode Low |
| Desat High | | | |
| Desat Low | X | X | |
| Desat circuit fail high | | | |
| Desat circuit fail Low | X | | X |

As can be seen in the illustrative, but non-limiting, table above, the DESAT signal output by the first blanking delay component 144 is nominally high when no DESAT condition is detected. On the other hand, if the first light source LED1 output is high or a DESAT overload condition or transistor off condition is detected simultaneously, then the DESAT signal output by the first blanking delay component 144 may be low—thereby indicating a DESAT condition. With respect to the second blanking output component 148, if the first light source LED1 output is low or the DESAT overload condition or transistor off condition is detected simultaneously, then the DESAT circuit failure signal may be low—thereby indicating a DESAT detection circuit 164 failure. Of course, the logic of the signals may be reversed such that a high output signal by either blanking delay component 144, 148 is a positive indication of a DESAT condition and/or DESAT detection circuit 164 failure.

Figure 2:
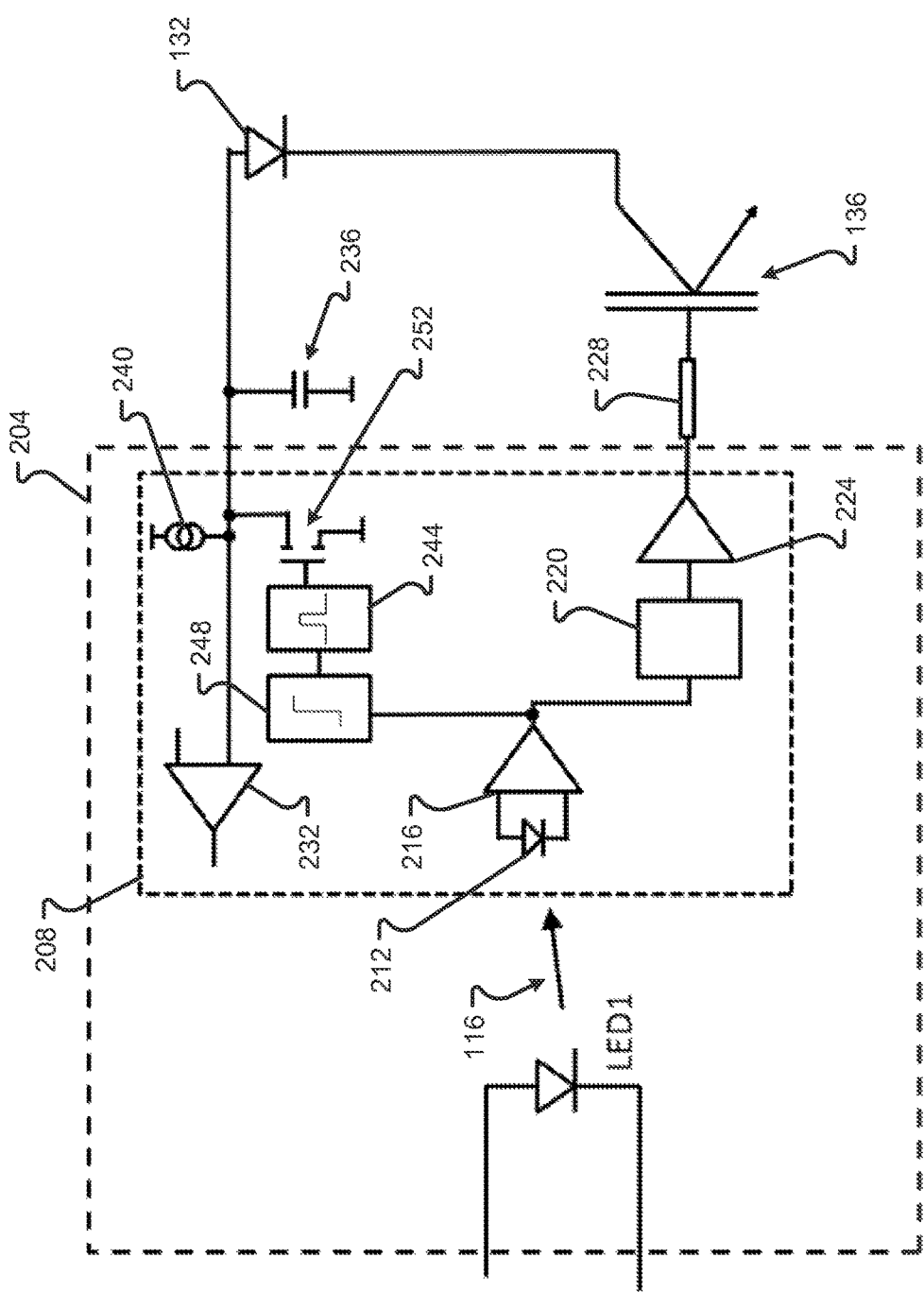
FIG. 2 is a block diagram depicting a blanking circuit used for a DESAT capacitor in accordance with at least some embodiments of the present disclosure.

With reference now to FIG. 2, additional details of another collection of IC chips 204 will be described in accordance with at least some embodiments of the present disclosure. It should be appreciated that any combination of elements depicted and/or described in connection with FIG. 2 may be implemented in addition to or in lieu of the components depicted in the isolation system 100 of FIG. 1.

FIG. 2 illustrates an output IC chip 208 receiving an optical signal 116 from a first light source LED1, which may be similar or identical to the first light source LED1 depicted and described in connection with FIG. 1. Again, however, other isolation techniques can be used without departing from the scope of the present disclosure.

The output IC chip 208 is further depicted to include a light detector 212 and an amplifier 216. An output of the amplifier 216 is provided to an edge detector 248, a pulse generator 244, and switch 252. In some embodiments, the output of the amplifier 216 is also provided to a delay circuit 220 and a second amplifier 224, which provides an output to load 228 and the transistor 136.

The edge detector 248, pulse generator 244, and switch 252 may collectively operate to control the discharge period of a DESAT blanking capacitor 236. In particular, the DESAT blanking capacitor 236 discharge period may be set by a monostable pulse generator, which is activated on the rising edge of the transistor 136 turn-on signal (output by the amplifier 216). The width of the pulse generated by the monostable pulse generator may be sufficient to ensure that the blanking capacitor 236 is fully discharged and to provide transient noise rejection during the transistor 136 turn-on. To ensure that the DESAT detection circuit (e.g., the collection of the blanking capacitor 236, switch 252, current source 240, and sense circuit 232) is fully functional before the transistor 136 turns on, the signal used to turn on the transistor (e.g., provided by the output of the amplifier 216) is delayed by the delay circuit 220. In some embodiments, the delay circuit 220 delays the transistor 136 turn-on signal by an amount slightly less than the DESAT blanking period. As an example, the delay circuit 220 may delay the transistor 136 turn-on by approximately 100 ns.

When the transistor 136 is turned on, the blanking capacitor 236 is discharged. After discharge, if the blanking capacitor 236 is observed to begin recharging, then it can be determined that there is a short circuit condition. In particular, if the blanking capacitor 236 is observed to begin recharging, then there would be a full voltage detected at the comparator 232 of the sense circuit (e.g., approximately 7.0V or whatever the supply voltage corresponds to). In this way, the DESAT detection circuit provided in the output IC chip 208 may be used to detect when the transistor 136 is off as well as when the transistor 136 is overloaded.

Figure 3:
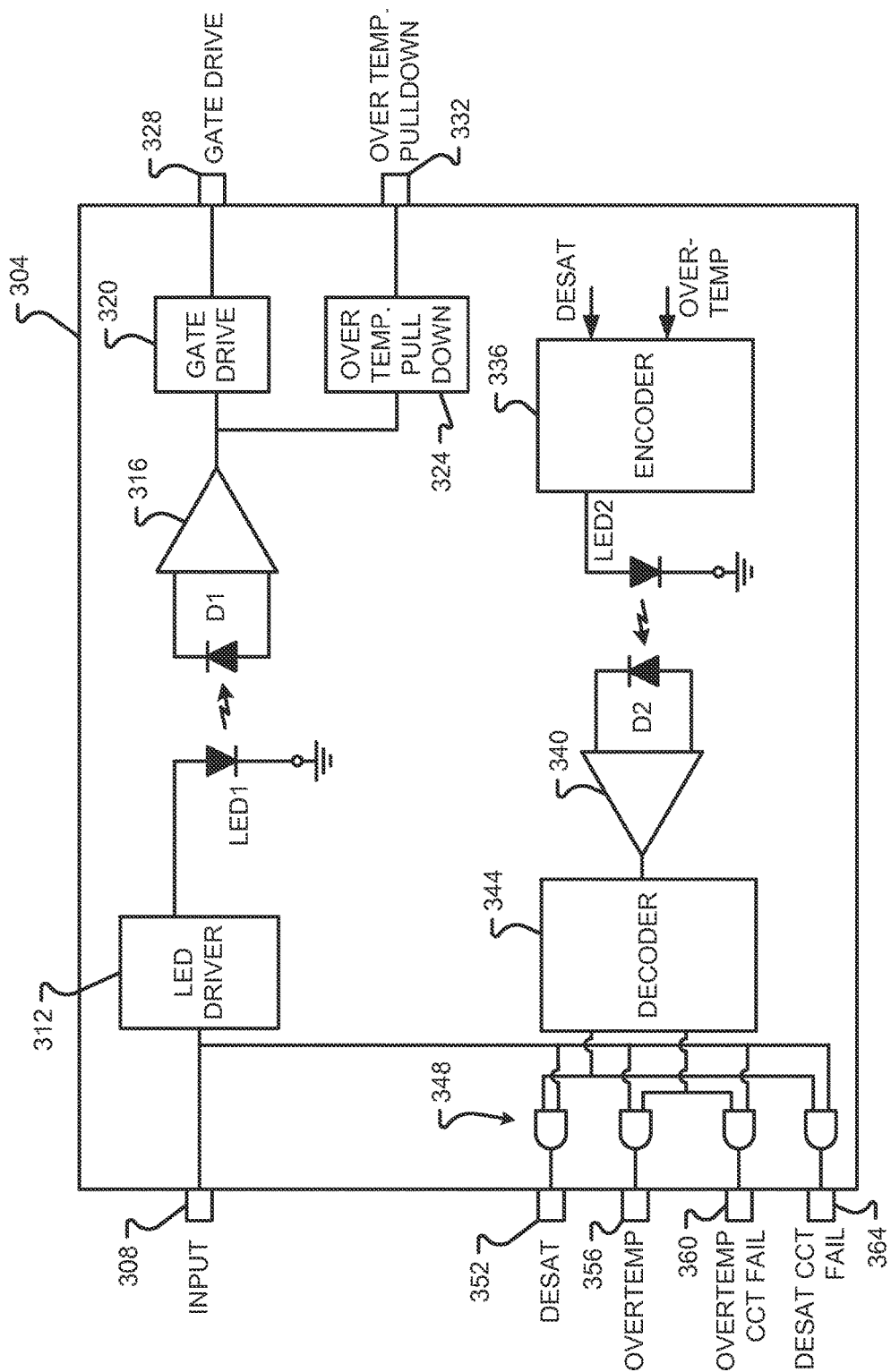
FIG. 3 is a block diagram depicting illustrative components of an Integrated Circuit (IC) chip in accordance with at least some embodiments of the present disclosure.
Figure 4:
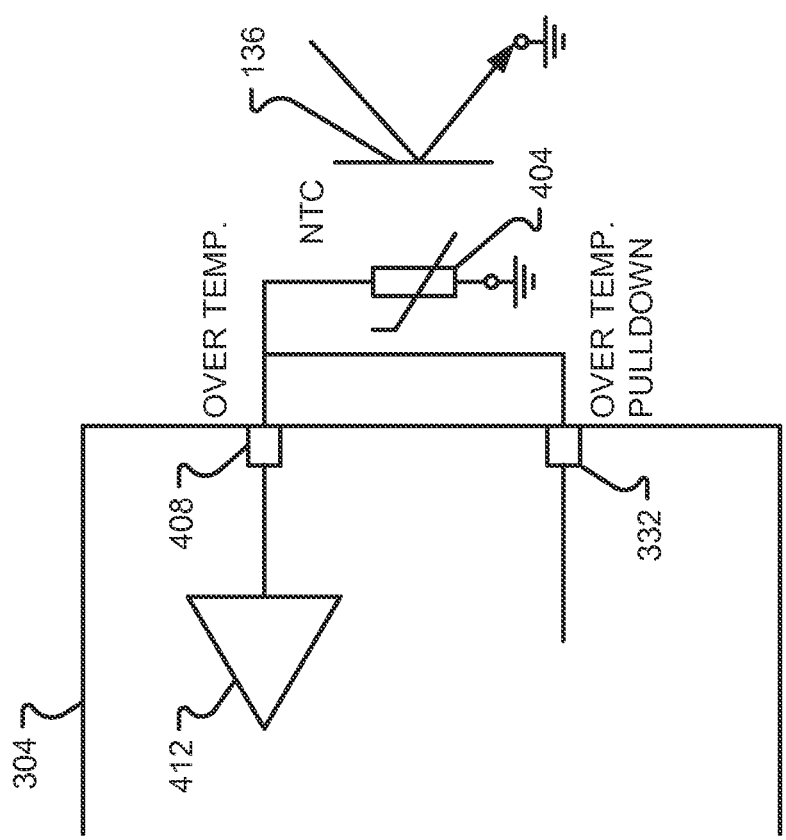
FIG. 4 is a block diagram depicting components of an IC chip used to monitor and react to over-temperature conditions in accordance with at least some embodiments of the present disclosure.

With reference now to FIGS. 3 and 4, additional components used to monitor other operating characteristics of a transistor 136, such as over-temperature conditions, will be described in accordance with at least some embodiments of the present disclosure. In particular, FIG. 3 depicts an illustrative safety circuit 304, which may be implemented on one or many IC chips. The circuit 304 is shown to include an input 308, a light source driver 312, a first light source LED1, a first light detector D1, a first amplifier 316, a gate driver 320, a gate drive output 328, an over-temperature pull down circuit 324, an over-temperature pull down output 332, an encoder 336, a second light source LED2, a second light detector D2, a second amplifier 340, a decoder 344, a bank of logic gates 348, and a plurality of outputs 352, 356, 360, 364. It should be appreciated that some or all of the components depicted and described in connection with FIGS. 3 and/or 4 may be implemented in any other circuit or isolation system (e.g., the first isolation system 100) depicted and described herein. For instance, the isolation system 100 may be configured to further incorporate aspects of the over-temperature detection circuitry depicted and described in connection with FIGS. 3 and 4.

In some embodiments, the first light source LED1, the second light detector D2, and the components electrically connected thereto may operate in a first isolated circuit, which may be similar to the first isolated circuit 108. Conversely, the first light detector D1, the second light source LED2, and the components electrically connected thereto may operate in a second isolated circuit, which may be similar to the second isolated circuit 112.

In some embodiments, an input electrical signal is received at the input 308 and provided to the light source driver 312, which provides a driving current to the first light source LED1. The first light source LED1 produces an optical signal, which is transmitted across an isolation boundary and received at the first light detector D1, which may correspond to a photodiode, a PIN-type photodiode, or the like. The first light detector D1 provides an electrical output indicative of the optical signal received at the first light detector D1 to the first amplifier 316. The output of the first amplifier 316 may correspond to an amplified version of the signal output by the first light detector D1. This amplified signal can be simultaneously provided to the gate driver 320 and over-temperature pull down circuit 324. The gate driver 320 provides a driver output signal via the gate drive output 328 while the over-temperature pull down circuit 324 provides and over-temperature pull-down signal via the output 332.

A DESAT signal and over-temperature signal can be simultaneously provided to an encoder 336, which encodes an electrical signal that is used to drive the second light source LED2. The DESAT signal may be generated in accordance with the principles described in connection with FIG. 2. The over-temperature signal may be generated as will be discussed in further detail with reference to FIG. 4. Again, the second light source LED2 generates a second optical signal that is transmitted across the isolation boundary and then received at the second light detector D2. The second light detector D2 produces an electrical signal that is amplified at the second amplifier 340 and provided to a decoder 344. The decoder 344 may provide a plurality of outputs to the bank of logic gates 348. Each logic gate in the bank of logic gates may also be receiving the input signal 308 that is provided to the driver 312. The signals received at each of the logic gates 348 may be compared and/or combined to produce one or more of the following outputs: a DESAT signal output 352 (indicative of a DESAT condition at the transistor); an over-temperature signal output 356 (indicative of an over-temperature condition); an over-temperature circuit failure output 360 (indicative of a failure of the over-temperature pull down circuit 324; and/or the DESAT detection circuit failure signal (indicative of a failure of the DESAT detection circuit 164). Any or all of these outputs may be determined and provided to an appropriate mechanism that can report the detected conditions and/or make an appropriate modification to the behavior of the transistor. As an example, should an over-temperature condition be detected, the transistor 136 may be turned off to prevent catastrophic damage from occurring to the transistor 136.

To allow the over temperature circuit 304 to be monitored when the gate driver 320 is in the off sate, a pull-down circuit 324 is employed. The pull-down circuit 324 is added to artificially cause a drop in the measured temperature sense voltage. If a Negative Temperature Coefficient (NTC) temperature sensor 404 is implemented in the power module, this pull-down circuit 324 could be connected directly to the NTC sensor 404 via the over-temperature pull-down output 332. Activation of this pull-down circuit 324 may activate the over temperature alarm signal that is provided back to an over-temperature input 408 and amplifier 412 such that the alarm signal can be provided to the encoder 336 as an over-temperature signal. On the input buffer circuit, the decision to flag the over-temperature status to the output pin 332 may be dependent on the status of the input signal 308. If the input signal 308 is on and the over-temperature signal is activated, if the signal is activated on the output pin, and if the input signal is off, the over temperature signal is ignored. Should the input signal 308 be off and no over-temperature signal is received, this is flagged as a failure in the over-temperature check circuit.

Specific details were given in the description to provide a thorough understanding of the embodiments. However, it will be understood by one of ordinary skill in the art that the embodiments may be practiced without these specific details. In other instances, well-known circuits, processes, algorithms, structures, and techniques may be shown without unnecessary detail in order to avoid obscuring the embodiments.

While illustrative embodiments of the disclosure have been described in detail herein, it is to be understood that the inventive concepts may be otherwise variously embodied and employed, and that the appended claims are intended to be construed to include such variations, except as limited by the prior art.

What is claimed is:

1. A circuit, comprising:
    at least one Insulated-Gate Bipolar Transistor (IGBT) having a gate, collector, and emitter;
    a detector circuit coupled to the IGBT and including an output that outputs a driver current for the IGBT based on a signal detected by the detector circuit;
    an IGBT desaturation detection circuit coupled to the output of the detector circuit and that checks and monitors desaturation functionality of the IGBT before startup of the IGBT and during operation of the IGBT, wherein the IGBT desaturation detection circuit comprises a blanking capacitor discharge circuit that includes a blanking capacitor that is active during a transition of the IGBT from an off state to an on state; and
    a delay circuit coupled between the gate of the IGBT and the output of the detector circuit and that delays the transition of the IGBT from the off state to the on state by a delay period to test functionality of the IGBT desaturation detection circuit.

2. The circuit of claim 1, wherein the IGBT desaturation detection circuit comprises a current source coupled to a comparator to detect the desaturation functionality of the IGBT.

3. The circuit of claim 1, wherein the IGBT desaturation detection circuit is active while the IGBT is in the on state and wherein the IGBT desaturation detection circuit is also active while the IGBT is transitioning from the on state to the off state.

4. The circuit of claim 3, wherein the IGBT desaturation detection circuit is deactivated between a time immediately before and immediately following a transition of the IGBT from the off state to the on state.

5. The circuit of claim 1, further comprising:
    a pulse generator coupled to the output of the detector circuit and that controls a discharge period for the blanking capacitor according to a rising edge of an IGBT turn-on signal.

6. The circuit of claim 5, wherein a width of a pulse produced by the pulse generator is wide enough to ensure that the blanking capacitor is fully discharged and as to provide transient noise rejection for the IGBT during the on state.

7. The circuit of claim 1, wherein the IGBT desaturation detection circuit is fully functional before the IGBT begins transitioning from the off state to the on state and wherein the delay period is less than a blanking period of the blanking capacitor.

8. The circuit of claim 1, wherein the IGBT desaturation detection circuit comprises logic that produces a desaturation overload signal and a signal indicative of a failure in the IGBT desaturation detection circuit.

9. The circuit of claim 1, further comprising:
    an over temperature circuit that monitors a temperature condition of the IGBT and disables the IGBT in response to determining that the temperature condition has exceeded a predetermined temperature threshold.

10. The circuit of claim 9, wherein when the IGBT is in the off state, a pull down circuit is used to artificially cause a drop in a measured temperature sense voltage for monitoring the temperature condition.

11. The circuit of claim 1, further comprising:
    an over current detection circuit using an emitter sense resistor and comparator circuit.

12. The circuit of claim 11, wherein when the IGBT is in the off state, a current source is switched to the emitter sense resistor which causes an over current condition.

13. An Insulated-Gate Bipolar Transistor (IGBT) monitoring system, comprising:
    a detector circuit including an output that outputs a driver current for an IGBT based on a signal detected by the detector circuit;
    an IGBT desaturation detection circuit that checks and monitors desaturation functionality of the IGBT before startup of the IGBT and during operation of the IGBT; and
    a delay circuit coupled between the IGBT and the output of the detector circuit and that delays the startup of the IGBT by a delay period to test functionality of the IGBT desaturation detection circuit.

14. The IGBT monitoring system of claim 13, wherein the IGBT desaturation detection circuit comprises a current source and comparator that are used to detect the desaturation functionality of the IGBT, wherein the IGBT desaturation detection circuit is active while the IGBT is in an on state and wherein the IGBT desaturation detection circuit is also active while the IGBT is transitioning from the on state to an off state.

15. The monitoring system of claim 14, wherein the IGBT desaturation detection circuit is deactivated between a time immediately before and immediately following a transition of the IGBT from the off state to the on state.

16. The IGBT monitoring system of claim 13, further comprising:
    an over temperature circuit that monitors a temperature condition of the IGBT and disables the IGBT in response to determining that the temperature condition has exceeded a predetermined temperature threshold, wherein when the IGBT is in an off state, a pull down circuit is used to artificially cause a drop in a measured temperature sense voltage for monitoring the temperature condition.

17. The IGBT monitoring system of claim 16, further comprising:
    logic that produces a desaturation overload signal and a signal indicative of a failure in the IGBT desaturation detection circuit, wherein the logic further produces a signal indicative of a failure in the over temperature circuit.

18. The IGBT monitoring system of claim 13, wherein the IGBT desaturation detection circuit comprises a blanking capacitor discharge circuit that includes a blanking capacitor that is active during a transition of the IGBT from an off state to an on state.

19. An isolation system, comprising:
    a first circuit operating at a first voltage;
    a second circuit operating at a second voltage, wherein the second circuit receives information from the first circuit across an isolation boundary that inhibits electrical communication between the first circuit and second circuit;
    an Insulated-Gate Bipolar Transistor (IGBT) having a gate, collector, and emitter in electrical communication with the second circuit;
    a desaturation detection circuit that checks and monitors desaturation functionality of the IGBT before startup of the IGBT and during operation of the IGBT; and
    a delay circuit coupled to the gate of the IGBT and that delays the startup of the IGBT by a delay period to test functionality of the desaturation detection circuit.

20. The isolation system of claim 19, wherein the information received at the second circuit from the first circuit is communicated via at least one of optical signals, capacitive coupling, and inductive coupling.

* * * * *